United States Patent [19]

Lapeyre

[11] Patent Number: 4,999,795
[45] Date of Patent: * Mar. 12, 1991

[54] PORTABLE KEYBOARD OPERATED ALPHA COMPUTER SYSTEM WITH FEW KEYS AND VISUAL KEYSTROKE INSTRUCTIONS

[75] Inventor: James M. Lapeyre, New Orleans, La.

[73] Assignee: The Laitram Corporation, New Orleans, La.

[ * ] Notice: The portion of the term of this patent subsequent to Aug. 22, 2006 has been disclaimed.

[21] Appl. No.: 330,988

[22] Filed: Mar. 29, 1989

Related U.S. Application Data

[63] Continuation of Ser. No. 158,653, Feb. 22, 1988, Pat. No. 4,860,234, which is a continuation-in-part of Ser. No. 729,559, May 2, 1985, abandoned, and a continuation-in-part of Ser. No. 844,872, Mar. 27, 1986, abandoned, each is a continuation-in-part of Ser. No. 459,998, Jan. 21, 1983, Pat. No. 4,547,860.

[51] Int. Cl.$^5$ .............................................. G06F 3/023
[52] U.S. Cl. ........................... 364/709.16; 364/709.15
[58] Field of Search .................. 364/709.16, 709.15; 341/22

[56] References Cited

U.S. PATENT DOCUMENTS

| | | | |
|---|---|---|---|
| 3,675,513 | 7/1972 | Flanagan et al. | 364/709.16 |
| 3,967,273 | 6/1976 | Knowlton | 341/22 |
| 4,718,029 | 1/1988 | Morino et al. | 364/709.16 |

OTHER PUBLICATIONS

C. K. Clauer et al., "Computer-Assisted Word Entry Process", IBM TECHNICAL DISCLOSURE BULLETIN, vol. 21, No. 10, Mar. 1979, p. 4184.

Primary Examiner—David H. Malzahn
Attorney, Agent, or Firm—Laurence R. Brown

[57] ABSTRACT

Alphameric electronic computers are made with fewer keys in keyboard assemblies for selection of a large range of input characters and instructions. To achieve this the computer and keyboard operates in two modes with one providing for example decimal digit processing from single keystroke entries and the other providing for example alphabetic character processing from two successive keystroke entries. The keys, strokes and instructions are cooperatively integrated by means of a visual display integrally located on the computer with coded indicia representing the entries and identifying the key or keys to be stroked and in the case of successive keystrokes representing the sequence of stroking. Accordingly reference to external manuals for computer operating or data entry instructions is rarely necessary.

29 Claims, 4 Drawing Sheets

| 1 | 2 | 3 |
|---|---|---|
| A₁ B₃ C₆ | D₁ E₂ F₆ | G₄ H₂ I₃ |
| J₄ K₅ L₂ | M₄ N₃ O₅ | P₅ Q₁ R₆ |

| S₁ T₄ U₅ | V₆ 1₁ 2₂ | 3₃ 4₄ 5₅ |
|---|---|---|
| W₆ X₂ Y₃ | Z₅ 6₄ 7₃ | 8₂ 9₁ 0₆ |
| 4 | 5 | 6 |

PORTABLE KEYBOARD OPERATED ALPHA COMPUTER SYSTEM WITH FEW KEYS AND VISUAL KEYSTROKE INSTRUCTIONS

This is a continuation of U.S. Ser. No. 07/158,653 filed Feb. 22, 1988 of the same title, now U.S. Pat. No. 4,860,234 Aug. 22, 1989, which in turn is a continuation-in-part of copending cases U.S. Ser. No. 729,559 filed May 2, 1985 for "Programmable Computer with Alphanumeric Capabilities having Few Keyboard Keys", now abandoned, and U.S. Ser. No. 844,872 filed Mar. 27, 1986 for "Keyboard Located Indicia for Instructing a Multi-mode Programmable Computer Having Alphanumeric Capabilities from a Few Keyboard Keys", now abandoned, both being continuations-in-part of U.S. Ser. No. 459,998 filed Jan. 21, 1983 for "Computer Keyboards With Fe Keys Designating Hundreds of Function", now U.S. Pat. No. 4,547,860, Oct. 15, 1985. These background applications are incorporated herein in entirety by reference.

TECHNICAL FIELD

This invention relates to portable hand held alphameric keyboard-computer systems and more particularly it relates to the operation of computers with fewer keys by means of an alphabetic character entry mode requiring two or more successive keystrokes per character from as few as six keys and wherein keystroke instructions for the selection of keys and the sequence of stroking for the alphabetic characters are visually displayed as indicia to preclude reference to operation manuals.

Art such as U.S. Pat. No. 3,892,958, C. Tung, July 11, 1975 and U.S. Pat. No. 3,967,273, H. Knowlton, June 29, 1976; and European Patent Application No. 11,307, filed Nov. 19, 1979 all relate to the multiple use of keyboard keys for reducing the number of keys required on a keyboard for processing data. This is particularly desirable for hand carried portable alphanumeric computer systems now feasible in the art, which are capable of processing many input characters and of internally processing many algebraic and data processing functions. Both numerics and alphabets are required in the present state of the art for communication, calculating and data processing operations of the type performed in portable hand held keyboard actuated computers.

The Knowlton patent reduces the number of keys required in a telephone instrument for alphanumeric transmission capabilities to twelve by requiring two successive choices of tone signals for every entry digit such as numeral 2 or letter k. The Tung patent reduces in a computer-keyboard system the number of keys by providing three functions for designated keys with two sets of alternative functions chosen by respective orange or blue prefix keys. Thus, a calculator with thirty-two keys can be used for about three times that many functional computer entries including instructions and data. This latter concept is used, for example, in "Hewlett-Packard" Model HP-41 type programmable calculators with full alphanumeric capabilities. Similarly "Texas Instruments" TI-88 line of programmable calculators have alphabetic capabilities with two keyboard functions selectable, plus an alphabetic entry mode.

The general state of the art of calculator systems with complex many functional capacity is represented by U.S. Pat. No. 3,863,060, to F. Rode et al., Jan. 28, 1975. The state of prior art portable hand held keyboard operated computers have still required excessive keys and have made alpha character entries awkward and time consuming. Also many prior art calculators have introduced alpha capabilities at the expense of utilizing 26 or more separate keys for the alphabet, sometimes using typewriter-like keyboards.

It is therefore an objective of this invention to provide improved alphanumeric entries with corresponding internal operational processing capabilities in hand held keyboard entry computer systems, and in particular to overcome deficiencies of the prior art. Other objects, features and advantages will be found throughout the following description, drawing and clams.

DISCLOSURE OF THE INVENTION

A portable hand held alphanumeric keyboard-computer system is provided having increased efficiency of the number of characters entered and the number of functions performable by a small number of keys, typically six to sixteen in a keyboard array. The keyboard provides for entry of a full set of alphabetic characters from a subcombination of the keys. The system is operable in different modes selected from the keyboard, namely, (a) a calculating keyboard mode (default mode) for primary entry of a first set of data and control functions in response to single keystrokes, (b) a control mode for entry of command functions in response to at least two keystrokes from predetermined keys, and (c) an alpha mode for entry of alphabetic characters in response to at least two sequential keystrokes form predetermined combinations of a subset of said keys.

In particular, significant advantage is obtained in a programmable calculator with alphanumeric capabilities, namely the facile entry of alphanumeric entries in the alpha mode. In this two stroke mode it is possible to enter the full 26 letter alphabet plus the decimal digits 0 to 9 with as few as six keys, although more keys might be desirable, since some decimal and control functions are usually required. It is preferable however, that the working minimum number of keys be 12, because the use of 12 keys permits the digits 0 through 9, the decimal point and a control function to be executed in a single stroke default mode. The entry of a single alphabetic character on the other hand requires two distinct keystrokes. The speed of entry need not be hampered however, since the keys may be laid out in an easily accessible array so that the area of search, (compared to a single key, single letter keyboard) for the first stroke of a desired alpha character can be reduced to about 1/9 of the single stroke keyboard and is, for example, contained in a very small area occupied by only three keys. In fact, searching over such a small area for the desired letter, (on one of three keys), touching that key and then touching a second key at a known position (as indicated visually on a viewing panel in proximity to the first key touched) is sometimes faster than searching for a letter among twenty six keys and then striking that key once. This can be especially valuable for persons who "hunt and peck".

Cooperatively associated with the keys in a visible location integral with the keyboard assembly is a set of abbreviated instruction indicia designating keystroke selection sequences available from the computer for processing a corresponding set of computer commands for data entry and data processing operations. In particular, the two sequential keys to be stroked for entry of each alpha character are identified by visual indicia signifying the stroking sequence and the keys to be selected.

The keyboard of the preferred embodiment provides for entry of a set of key actuated computer operations including a subset of a large number of calculator command functions for data processing, a subset of numeric characters processable by the computer and a full subset of alpha characters processable by the computer. The latter is achieved by way of an alpha mode of operation responsive to sequential stroking of two keys in a mutually exclusive time sequence for each key command to enter alphabetic characters as digital signals. The computer has processing systems for entering, controlling and processing such digital signals in direct response to keystroke sequences.

In general, significant and unexpected advantage is achieved in reducing the number of keyboard keys required for processing alpha characters in hand held portable computer-keyboard systems, contrary to the trend in the art to expand the number of keys to produce more input selections necessitated by alphabetic characters or additional functional commands.

The visual display instructions eliminate the need for reference to operation manuals for entry of alpha characters and selection of many functions from the keyboard in a two stroke sequence, since both the first keystroke selections and the second keystroke selections are identified thereby. This is a particularly important feature in portable manual keyboard entry computer systems with limited space and wherein more closely packed keys do not give adequate room for manual actuation by the fingers.

BRIEF DESCRIPTION OF THE DRAWINGS

In the accompanying drawings:

FIG. 4 is an alternate alpha keyboard layout on a computer having a computer processed temporary display panel for indicating the functions and modes being currently processed by the computer.

THE PREFERRED EMBODIMENTS

Figure 1:
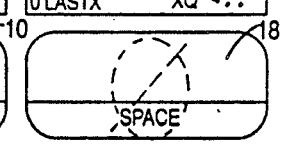
FIG. 1 is a plan view of one preferred embodiment of a computer keyboard panel embodying the invention, wherein all twenty six alphabet characters are presented on only three of the sixteen keys.
Figure 1:
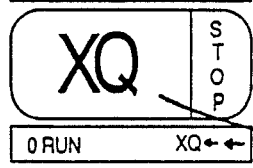
Figure 4:
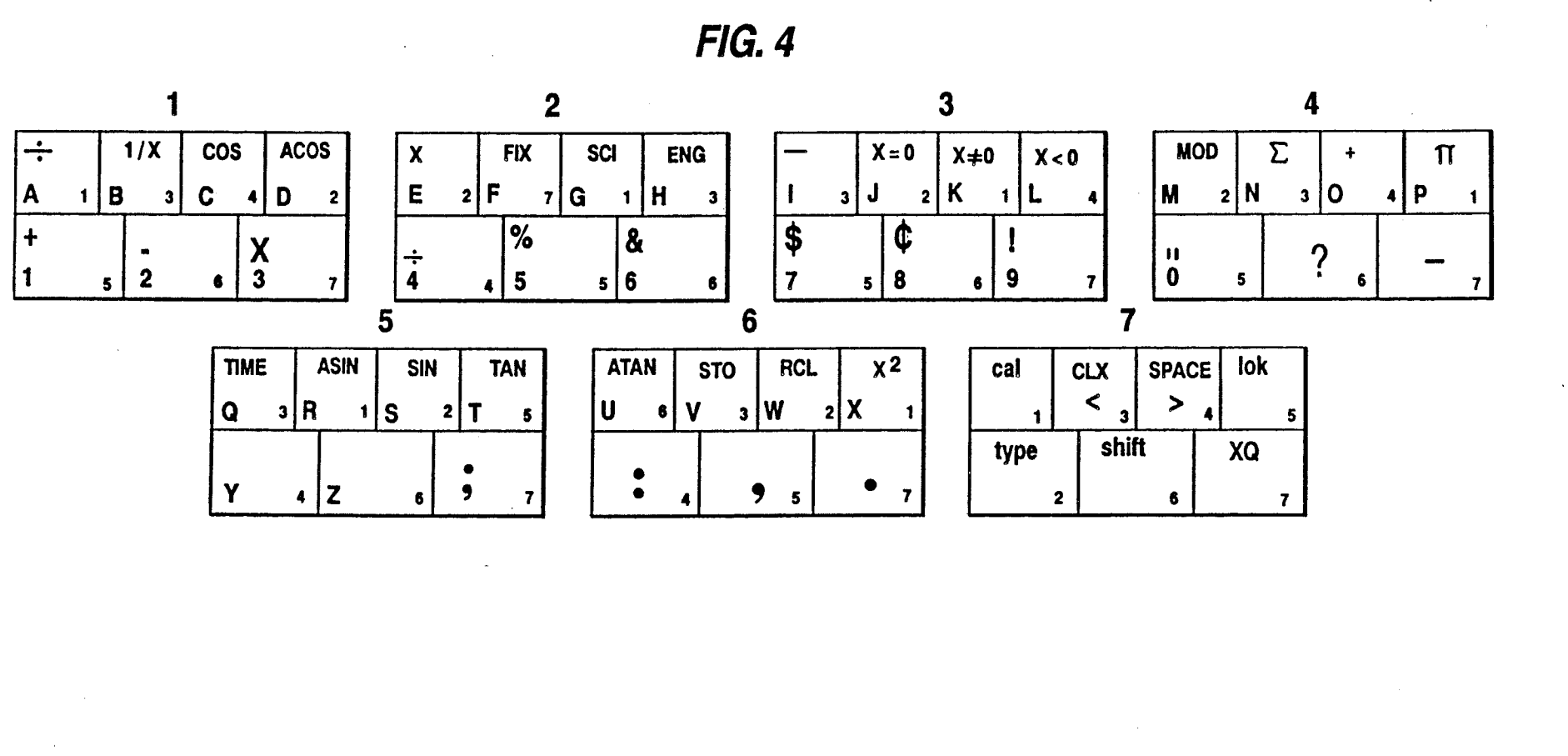

In the generally similar keyboard arrays of FIGS. 1 and 4, sixteen keys are provided with spacings for ready manual access for touch typing, if desired. The keys operate in a primary default mode as a live keyboard for entry with single keystrokes. The indicia on the keys identify these entries as the ten decimal digits 0 through 9, some arithmetic operations for add, multiply, subtract and divide, a decimal key and an execute (XQ) control key for changing computer modes and entering computer commands. Other special purpose keys in addition to the four arithmetic keys may be provided, if desired. For example, the computer mode may be changed from one stroke per entry to two strokes per entry operation by the first stroke of the execute key.

In the data entry mode (either numeric or alpha) the successive characters of a multiple character word, such as a decimal number, are terminated and entered into an appropriate computer memory bank by the second stroke of the decimal point key 10 as indicated by the entry arrow notation. This mode of operation is described more fully in my U.S. Pat. No. 4,567,567, Jan. 28, 1986 and U.S. Pat. No. 4,680,725, July 14, 1987. The entered data words are then subject to the conventional computer operations such as arithmetic or data processing steps or sequences performed by stored program routines.

In the two stroke per entry mode the sixteen keys will provide at least 256 keystroke entry choices. Thus multiple choice indicia arrays are located in proximity to the keys to identify which key is to be chosen for a first stroke of a command identified by abbreviated or coded instructions. The second keystroke is identified by the key name legend alongside the coded command instruction. Appropriate computer program subroutines are selected by entry of the various commands. For example, the keystrokes to enter the program mode (in the lower right hand corner) are indicated by entry 14 labelled 3PRGM, operable after the XQ key is stroked once to enter the two stroke per entry mode. Thus the first stroke is designated by the proximity of the indicia grouping to the XQ key, and the second stroked is identified as the "3 " key.

Now in accordance with this invention a complete set of alphabetic characters may be entered by a subset of as few as six keys in the two stroke per entry mode. Therefore the first XQ stroke commands the computer to execute a two stroke sequence. For the program mode the two stroke sequence is XQ-3. So, to put the computer in the program mode the keystrokes required ar XQ-XQ-3. Once in the Program mode, which is a TWO STROKE mode, only two strokes are required to perform most functions.

In the FIG. 1 embodiment, the subset of three keys 4, 5 and 6, are used in the alpha mode to find and select any of the alphabet characters, as indicated by the notation on the keyfaces. This advantageously saves search time for locating the alphabet from among sixteen keys and provides fast and accurate touch typing with three fingers having a home position from which the first stroke for each alphabetic character is selected without taking any time for moving fingers. The second sequential stroke as identified on the coded instructions, for this keyboard embodiment, are chosen for easy and quick fingerstroking from the home keys. Note, in this respect, that the most used character "e" is a double stroke of the "5" key not requiring any finger movement to reach a key for the second stroke.

The two sequential key strokes to enter the alpha mode (see lower right corner, 9) thus are made with the XQ key 12 and the decimal point/enter key 10. This mode extends the choices of keyboard entries from the sixteen keys beyond 256, by making the additional choices noted on the keyfaces available, including the alphabetic character choices on the 4, 5, and 6 keys. Thus, in the alpha mode, visual indicia means is provided for signifying the two keys to select and the sequence of stroking those keys by positioning the multiple choice menu in proximity to the key to be selected for the first stroke.

In this embodiment, a further subset of keys is selected and automatically activated after the first stroke for entry of the second stroke, namely the eleven keys comprising the nine decimal digit keys 1 to 9, the add key and the subtract key. Note also that in this alpha mode the decimal or period is selected by a 2-2 keystroke sequence, 24. By providing this alpha mode, thus 81 extra selections are available from the nine decimal digit keys 1 to 9 provide substantially 337 selections from the respective two modes.

To retain the advantage of single stroke per entry or live keyboard mode for entry of decimal digits in the alpha mode, the decimal point key 10 serves as an alpha-decimal or single-double stroke toggle key, and is thus identified as a shift key. Similarly the decimal digit key "0" is used for the space key, which is frequently used in alpha entries.

To exit the alpha mode, the original alpha toggle selection sequence 9 is used. The program mode toggle, 14, is similarly actuated by a two stroke sequence, and it may include an automatic concurrent selection of the alpha mode.

Figure 2:
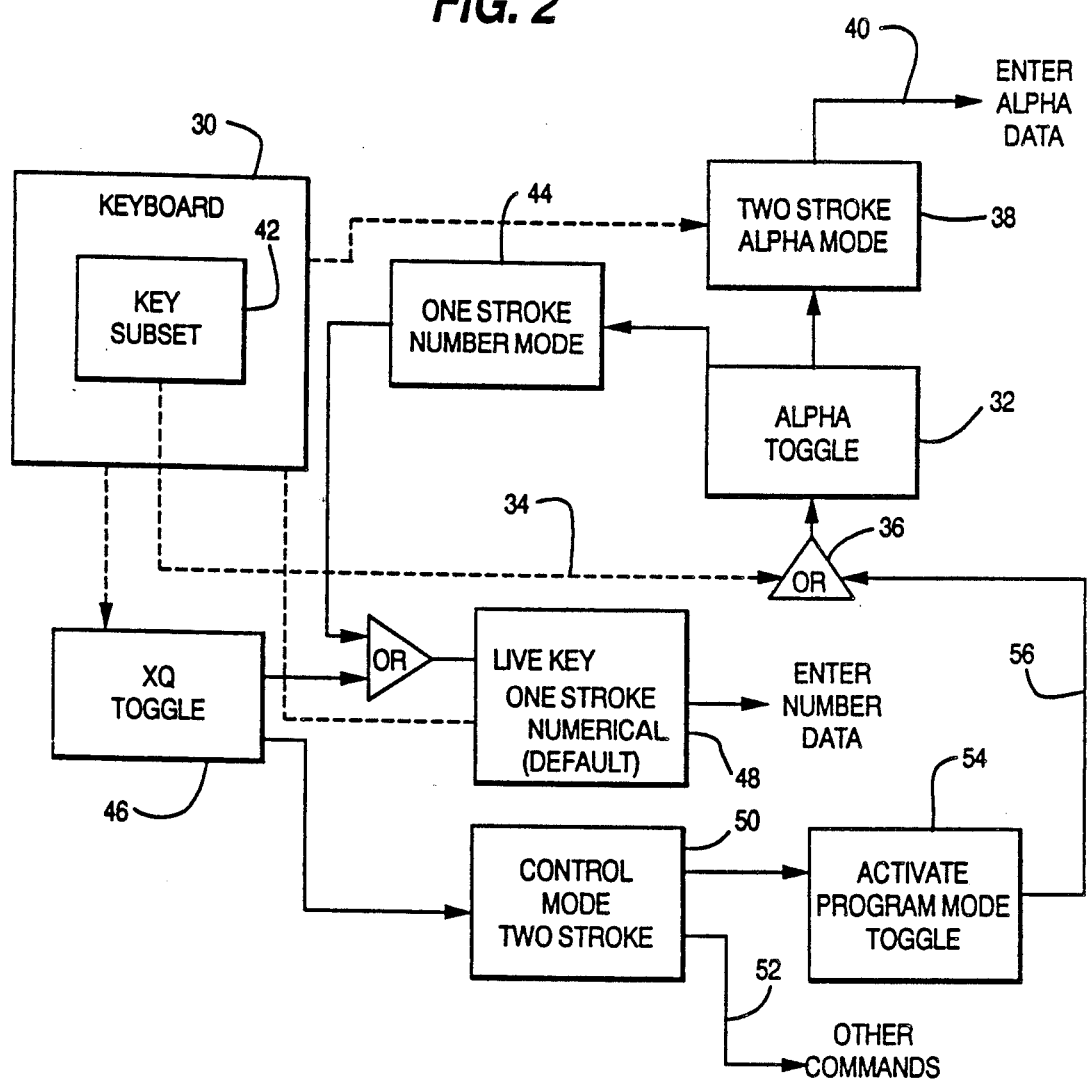
FIG. 2 is a block system diagram of control means afforded in a preferred embodiment of the invention.

The general system organization is shown in the block functional flow diagram of FIG. 2. The key actuation function flow lines from the keyboard 30 are shown in dotted line form. Pertinent control function interactions are shown in full line form.

It is clear that novel mode changing and two stroke per entry features are afforded by this invention thereby unexpectedly improving the state of the art by providing greater keyboard capacity with fewer keys, such as twelve or sixteen, for providing a large number of entry and command function choices, including all the alphabetic character selections usually performed on a full keyboard typewriter of over fifty keys. There has not been heretofore provided in this hand held computer art any recognition that alphameric operation could be afforded by a two stroke per entry in the computer-keyboard interface to provide an alphbetic character entry mode using as few as six keys.

Now with reference to FIG. 2, the alphabetic mode toggle 32 is actuated by the alpha command initiated by the two stroke sequence of the XQ key 12 and the decimal point key 10, as explained. Thus the key actuation flow line 34 leads from keyboard 30 to the "Or" circuit 36. The alpha toggle 32 thus selects the alpha mode 38 requiring two strokes for entry of each alpha character in response to keys in the subset 42, for the purpose of entering alpha data into the computer 40. The toggle is thereafter converted to the live keyboard one stroke per entry number mode 44 by a further actuation of alpha toggle 32 from the keyboard 30, such as by a single stroke of the decimal point key, which so operates in the alpha mode to provide a one stroke numeric digit entry for the next stroke. In the alpha mode then the alphabetic characters are successively entered with each two stroke selection forming a word that is ended with a single stroke of the "0" space key (18, FIG. 1) so operable in the alpha mode.

Note that line 34 is activated in the control mode which permits computer commands to be entered with two strokes per entry. This control mode is initiated by the XQ-keyboard instruction to the XQ toggle 46, which converts from the live key one stroke default mode 48 to the two stroke control mode 50. In the control mode the keyboard then can produce a large number of other commands 52, such as 256 from a sixteen key keyboard. One such command actuates the program mode toggle 54, which along line 56 also puts the alpha toggle into the alpha mode.

Figures 3, 5:
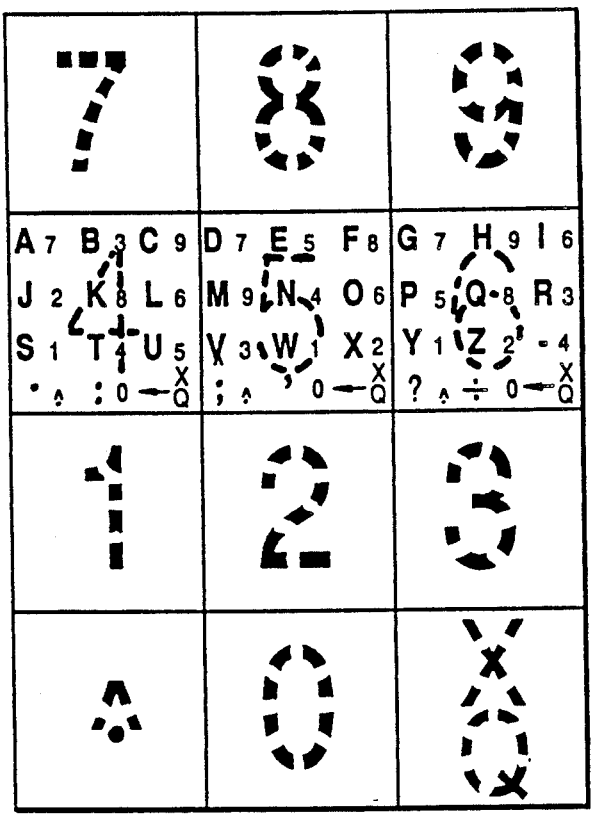
FIG. 3 is a six-key keyboard array capable of entering all twenty-six letters of the alphabet and the decimal digits 0 through 9 when operable in a two-stroke per entry mode.
FIG. 5 is a layout of a twelve key keyboard array for an alphameric computer embodiment adapted for single stroke entry of decimal digits and a two-stroke per entry mode for entry of alphabetic characters.

Although a preferred embodiment of sixteen keys has been discussed, it is possible to achieve complete entry of all twenty six alphabet characters along with ten extra entries such as the ten decimal digits with only six keys as illustrated in FIG. 3.

The keyboard configuration of FIG. 5 illustrates a twelve key keyboard array with all the alphabetic characters selected from the three keys 4, 5, and 6 for the initial keystroke. The nine keys 1 to 9 are activated after the initial stroke to receive the second stroke defining the particular character chosen from the menu on the respective keyface chosen for the first stroke. Other two stroke commands may be used for other functions not shown. It should be clear from the various embodiments that the accompanying indicia for showing a menu of selections in the alpha and other two-stroke modes of operation, provides by proximity location with respect to a particular key a first stroke choice for any of the functions coded on that menu. Thus whether the menu is on the keyface itself or constitutes other equivalent indicia alongside the key, for which the FIG. 1 embodiment is an example, the instructions identify two keys and the sequence of selection of those two keys for a desired choice on the menu.

A different sixteen key embodiment 20 is shown in the embodiment of FIG. 4. Therein, the alpha key choices are all located in the top row of keys 7, 8, 9 and divide, adjacent the computer activated temporary display panel 21. After having shifted to a two stroke mode by a single stroke of the XQ key, the alpha toggle is actuated by the two strokes 7-8, as indicated by the "alpha" menu listing in proximity to the "7" key. Since the alpha mode is a two stroke mode, if the computer is already in alpha, no stroke of the XQ key is required. Similarly a shift toggle for lower and upper case is selected from the menu adjacent the "8" key as the 8-9 two stroke sequence. The shift lock instruction is in the menu adjacent the 9 key.

The computer actuated temporary display panel 21 provides visual indicia when prepared and presented in the computer. Thus the current modes or operational status of the keyboard are displayed, as for example the "alpha" mode and the shift "SHF" mode. THus, when in the alpha mode, further selections may be made to change the mode, or to provide a supplemental alpha mode as illustrated by the lower-upper case selections of the shift mode.

As explained before there also may be a "program" mode, which in the FIG. 1 embodiment has provided the alpha mode and at least 81 additional keyboard selections from the basic sixteen keys, when operating in the two stroke per selection mode. This is done by producing keyboard actuated mode changes when in the two stroke per entry mode that produces alternative functions from the same subsets of keys, such as the alpha subset of keys.

It is clear that this invention has provided for all the modes and all the operational choices within the capacity of the computer and keyboard options clear instruction for using the keyboard from visual indicia presented in the vicinity of the keys as the computer is being operated, from a combination of menus and indicators including the keyface notation, the menus adjacent the keys, and the temporary computer generated indicia on the display panel. Thus every step of a sequence of keystrokes is indicated, so that reference to an accompanying operation manual is rarely necessitated.

In particular the instructions to enter the alpha mode and to make choices when operating in the alpha mode are briefly reviewed with reference to the FIG. 1 embodiment. From the basic computer command mode, the alpha mode for entry of alphabetic characters by two strokes per selected character is initiated by two mode selection keystrokes, namely XQ-Decimal.

Within that alpha mode, the first stroke is chosen from a menu positioned in proximity to the key to be stroked first. In this embodiment that menu is on the keyface itself, but in the FIG. 4 embodiment it is in a menu displayed adjacent to the key location. The positioning of the menu therefore is the indicia that identifies the first alpha keystroke. Also this positioning of the menu identifies the sequence of stroking of the two keys.

A secondary indicia therefore is provided to identify the second key to be stroked for a selection on the menu. In this embodiment that is the alpha character prefix legend. For example "B" on the "4" key menu is preceded by a "7" indicating that to be the second key to be stroked after the computer is preconditioned and prepared by entry of the first keystroke. Thus an auxiliary menu is implicitly provided here to identify the second key in the two keystroke sequence.

Other choices are possible in the alpha mode. Mode changes to the single stroke per entry mode are thus accomplished with the XQ-decimal key sequence. In that mode decimal digits 0 to 9 are entered with a single keystroke. Other single stroke function choices, indicated by the keyface indicia here, are the arithmetic functions plus, minus, multiply and divide. In this case the functional selections afforded by the alpha keys are changed so that the keys now operate as decimal digit keys, without leaving the alpha mode. Also as hereinbefore explained, a space may be entered with a single stroke from the "Zero" key.

To leave the alpha mode and return to the basic command mode, two strokes (XQ-Decimal) are required to actuate the alpha toggle key 9.

It is clear therefore that this invention has for the first time provided alphameric computer-keyboard systems with fewer keyboard keys and additionally has provided integral instructions functionally related to the key locations for operation of the computer in various modes and in particular for a two stroke per entry alphabetic character selection mode without necessitating reference to an operation manual. Accordingly those novel features of the invention descriptive of the nature and spirit of the invention are defined with particularity in the following claims.

I claim:

1. The method of operating computer-keyboard systems having alphanumeric capability from a keyboard having a plurality of manually operated keys coupled on-line with the computer for entering numeric digits, alphabetic characters and computer instructions, including computer instructions for processing numeric digits and computer control functions in a numeric mode and for processing alpha data and computer control functions in the computer in an alpha mode, comprising the steps of:

operationally separating said plurality of keys into at least two different groupings with different corresponding functional operations, one said grouping comprising one subset of keys for input of numeric digits, and another said grouping comprising an alpha input subset of significantly fewer than n of said keyboard keys for entering a full set of n alphabetic characters into the computer, establishing a control mode in the computer for processing two-stroke digital signals generated from the keyboard keys to effect predetermined control functions, establishing in response to a keyboard entry of one of said computer instructions said alpha mode to enable the alpha input subset of said keys to enter for processing by said computer the n alphabetic characters responsive to at least two successive keystrokes from keys in said alpha input subset of keys, and processing in the computer said digital signals representing the alphabetic characters entered by said alpha input subset of keys and further digital signals representing numeric digits and computer instructions entered from the keyboard keys in the numeric mode of computer operation.

2. The method of claim 1 further comprising the step of providing no more than six keys in said alpha input subset of keys for entering a set of n alphabetic characters equal to twenty six for the English language, and ten keys in the further said subset for input of numeric digits.

3. The method of claim 1 further comprising the steps of providing nine keys in said alpha input subset of keys operable to produce digital signals from two successive keystrokes representing twenty six alphabetic characters (n=26), and coding the keys to provide an initial keystroke of the two successive keystrokes from three of the keys in the subset of nine keys for entry of all twenty six alphabetic characters.

4. The method of claim 1 further comprising the step of establishing said alpha mode in response to a computer instruction requiring a sequence of two successive keystrokes from said plurality of keys.

5. The method of claim 4 further comprising the steps of displaying indicia visible with the keyboard comprising first coded indicia designating the initial one of the two individual keys to be selected for the two successive keystrokes, further coded indicia visible with the keyboard designating the second successive keystroke for each of said n characters, and wherein said indicia visible with the keyboard further comprises means for designating the sequence of selection of the two successive keystrokes.

6. The method of claim 1 further comprising the steps of providing indicia at a site visible with said computer keyboard designating the first successive key to be stroked for said two successive keystrokes to select each of the n alphabetic characters in the set.

7. The method of claim 6 further comprising the step of positioning said indicia for identifying particular alphabetic characters in said set in a position in proximity to a respective key location thereby to signify that key to be stroked first for the two successive keystrokes required to enter that character into the computer.

8. The method of claim 6 further comprising the step of providing at the site of the indicia a visual marker designating the second successive key to be stroked in said two successive keystrokes to select each particular alphabetic character in the set in a format signifying that it is to be stroked in sequence after the first of the two successive keystrokes.

9. The method of claim 1 further comprising the step of providing visual markers identifying each of the two keys in said alpha input subset to be stroked for selection of individual alphabetic characters in said set in a format signifying the sequence of selection of the two successive keystrokes.

10. The method of claim 9 further comprising the step of producing computer generated temporary display means for displaying visual indicia to indicate that the computer is in the alpha node.

11. The method of claim 1 further comprising the step of providing for entry of the numeric digits in said alpha mode with a single keystroke per digit entry from said one subset of keys for the input of numeric digits.

12. The method of claim 11 further comprising in the step of separating keyboard keys into said two different subset groupings for the entry of alphabetic characters and decimal digits the substep of selecting common keys for the two subset groupings.

13. The method of operating a keyboard controlled portable hand carried computer system from an on-line in-situ keyboard having at least eleven manually operated keys effective to enter directly into the computer system digital keystrokes representing data and instructions including numeric digits and computer commands comprising the steps of:
establishing a subset of between three and nine of said keys effective to enter individual alphabetic characters of a character set into the computer system in response to two successive keystrokes of the keys in the subset,
operating the computer system from the keys to initiate an alpha operating mode for entering and processing said two successive keystrokes to represent alphabetic characters, and
establishing visual display means for identifying for selection in the alpha operating mode the individual alphabetic characters in said character set with separate indicia markers for providing identification of each of the two of said keys in said subset effective to enter individual alphabetic characters to be stroked for entry of respective individual characters and providing identification of the stroking sequence of those two keys to be selected for entry of each of the alphabetic characters.

14. The method of claim 13 further comprising the step of producing different computer modes of operation from the computer commands effected by said keystrokes wherein different computer functions are assigned to individual ones of the keys in the subset in said different computer modes of operation.

15. The method of claim 13 further comprising the steps of providing no more than six keys in said subset and operably coupling the subset keys with the computer in an operating mode for making computer entries only in response to two successive keystrokes per entry.

16. The method of claim 13 further comprising the steps of providing a further subset of ten of said keys operably coupled with the computer, and operating the subset of ten of said keys in a numeric mode of computer operation requiring a single keystroke for entry of a corresponding set of ten decimal digits from the ten keys in said further subset.

17. The method of claim 16 further comprising the step of operating said further subset of ten keys in a second mode of computer operation for producing a further set of computer input entries in response to two successive strokes per entry.

18. The method of operating a manual keyboard controlled computer system having a set of at least eleven keyboard keys connected at the computer site for on-line computer control by entry of data and computer commands from the keys comprising the steps of: providing an arithmetic processing mode of computer operation responsive to a subset of ten of said keys for entering decimal digits with a single keystroke per entry, providing an alpha data processing mode of computer operation responsive to a further subset of less than ten of the keys for entry of a set of alphabet characters into the computer with at least two successive keystrokes from the keys in said further subset required for entry of individual alphabet characters, and providing indicia visible to a keyboard operator identifying both the first and subsequent successive keystroke required for selection of the alphabet characters in said set.

19. The method defined in claim 18 further comprising the step of providing the indicia as alphabet characters in a multiple choice menu chart displaying a plurality of alphabetic characters positioned in proximity to at least some of the keys in said further subset to identify the location of a first key to be stroked for initiating said successive keystrokes for entry of individual alphabet characters provided on said menu chart.

20. The method defined in claim 19 further comprising the steps of providing said computer commands in response to two successive strokes of selected keyboard keys and a further menu chart therefor, with one said chart in a visible configuration on the keys on the keyboard, and with both said menu charts containing visual indicia designating and identifying a first and second keystroke required to make particular entries.

21. The method defined in claim 19 further comprising the steps of operating the computer system in a default single keystroke per entry numeric mode of keyboard operation, and permitting control from the keyboard in the default mode for entering said alpha data processing mode of operation for activating the keys in said further subset to enter said alphabet characters in response to said successive keystrokes.

22. The method defined in claim 18 further comprising the step of operating the computer system in the alpha data processing mode from the keyboard to enter spaces between words with a single stroke of one of said keys.

23. The method defined in claim 18 further comprising the step of operating the computer system from the keyboard in the alpha mode of operation with a single keystroke to establish said arithmetic processing mode of operation for entering decimal digits with a single keystroke per entry.

24. The method defined in claim 18 further comprising the step of providing further keys operable for selecting different computer arithmetic program operating subroutines with a single keystroke.

25. The method defined in claim 18 further comprising the steps of providing a default mode of computer operation, and entering the default mode from the alpha data processing mode of computer operation in response to a computer command instruction entered with two successive keystrokes from keys on the keyboard.

26. The method defined in claim 18 further comprising the step of providing by a computer command entered from the keyboard a further two-stroke-per-entry mode of computer operation of the individual keys in said further subset permitting entry of a different set of computer commands and data than employed for the same individual key in said alpha data processing mode of computer operation.

27. The method defined in claim 18 further comprising the step of providing an additional temporary visual indication generated by said computer to signify that the computer is operating in the alpha mode.

28. The method defined in claim 27 further comprising the step of providing in the alpha mode for entry of said computer commands and displaying further temporary visual indications in the alpha mode of computer operation signifying further operating conditions established by said entry of the computer commands in the alpha mode.

29. The method defined in claim 27 further comprising the step of providing a temporary visual indication for indicating entry of alpha characters in the lower case and in the upper case.

* * * * *